United States Patent
Nakata

(10) Patent No.: US 11,404,455 B2
(45) Date of Patent: Aug. 2, 2022

(54) IMAGING APPARATUS

(71) Applicant: SONY SEMICONDUCTOR SOLUTIONS CORPORATION, Kanagawa (JP)

(72) Inventor: Masashi Nakata, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 222 days.

(21) Appl. No.: 16/625,132

(22) PCT Filed: Jun. 7, 2018

(86) PCT No.: PCT/JP2018/021868
§ 371 (c)(1),
(2) Date: Dec. 20, 2019

(87) PCT Pub. No.: WO2019/009008
PCT Pub. Date: Jan. 10, 2019

(65) Prior Publication Data
US 2020/0295062 A1    Sep. 17, 2020

(30) Foreign Application Priority Data

Jul. 5, 2017    (JP) .............................. JP2017-132134

(51) Int. Cl.
*H01L 27/14*    (2006.01)
*H01L 27/146*    (2006.01)
(Continued)

(52) U.S. Cl.
CPC .. *H01L 27/14605* (2013.01); *H01L 27/14621* (2013.01); *H01L 27/14649* (2013.01); *H04N 5/341* (2013.01); *H04N 5/35563* (2013.01)

(58) Field of Classification Search
CPC ......... H01L 27/14605; H01L 27/14621; H01L 27/14649; H04N 5/341; H04N 5/35563
See application file for complete search history.

(56) References Cited

U.S. PATENT DOCUMENTS 5,576,562 A    11/1996 Konuma
5,796,095 A    8/1998 Matsuyama et al.
(Continued)

FOREIGN PATENT DOCUMENTS

CN    102938137 A    2/2013
CN    103004211 A    3/2013
(Continued)

OTHER PUBLICATIONS

International Search Report and Written Opinion prepared by the European Patent Office dated Aug. 6, 2018, for International Application No. PCT/JP2018/021868.

(Continued)

*Primary Examiner* — Kevin K Pyo
(74) *Attorney, Agent, or Firm* — Sheridan Ross P.C.

(57) ABSTRACT

There is provided an imaging apparatus including a first imaging element and a second imaging element configured to perform imaging in the same direction. The second imaging element is different in pixel arrangement between a central part and a non-central part, such that the pixels in the non-central part are more sensitive than the pixels in the central part. Image signals from the non-central part of the second imaging element are used to correct for shading (vignetting) in image signals from the first imaging element.

14 Claims, 13 Drawing Sheets

(51) Int. Cl.
*H04N 5/341* (2011.01)
*H04N 5/355* (2011.01)

(56) References Cited

U.S. PATENT DOCUMENTS

| | | | | |
|---|---|---|---|---|
| 7,282,686 | B2 * | 10/2007 | Ahn | H01L 27/14627 |
| | | | | 250/208.1 |
| 8,446,498 | B2 * | 5/2013 | Ishiwata | H01L 27/14645 |
| | | | | 348/273 |
| 2006/0027732 | A1 | 2/2006 | Ahn | |
| 2008/0165257 | A1 | 7/2008 | Boettiger | |
| 2008/0259194 | A1 | 10/2008 | Silverstein | |
| 2009/0167904 | A1 | 7/2009 | Matsushima | |
| 2011/0019041 | A1 | 1/2011 | Ishiwata et al. | |
| 2012/0062777 | A1 | 3/2012 | Kobayashi et al. | |
| 2013/0182158 | A1 | 7/2013 | Kobayashi | |
| 2013/0250153 | A1 | 9/2013 | Ishiwata et al. | |
| 2013/0314564 | A1 | 11/2013 | Kimijima | |
| 2013/0329099 | A1 | 12/2013 | Silverstein | |
| 2014/0043512 | A1 | 2/2014 | Kobayashi | |
| 2014/0152881 | A1 | 6/2014 | Ishiwata et al. | |
| 2015/0115385 | A1 | 4/2015 | Ishiwata et al. | |
| 2016/0037033 | A1 | 2/2016 | Kobayashi et al. | |
| 2016/0071895 | A1 | 3/2016 | Lee et al. | |
| 2016/0181304 | A1 | 6/2016 | Ishiwata et al. | |
| 2016/0293651 | A1 | 10/2016 | Kobayashi et al. | |
| 2016/0316155 | A1 | 10/2016 | Richards | |
| 2017/0133421 | A1 | 5/2017 | Kobayashi et al. | |
| 2017/0148835 | A1 | 5/2017 | Ishiwata et al. | |
| 2017/0148836 | A1 | 5/2017 | Ishiwata et al. | |
| 2017/0287961 | A1 | 10/2017 | Kobayashi et al. | |

FOREIGN PATENT DOCUMENTS

| | | |
|---|---|---|
| CN | 103748873 A | 4/2014 |
| CN | 106067953 | 11/2016 |
| GB | 2537745 | 10/2016 |
| JP | H09005610 A | 1/1997 |
| JP | 2009047978 A | 3/2009 |
| JP | 2011029379 A | 2/2011 |
| JP | 2016-034076 | 3/2016 |

OTHER PUBLICATIONS

Official Action (with English translation) for China Patent Application No. 201880042236.8, dated Feb. 2, 2021, 15 pages.

Zhu Xiaoxiao, Ren Siwei, Overview of on-chip CMOS Image Sensor ISP Circuit in Safety Surveillance System, 1001-5868 (2015) 05-0677-06. Chongqing Optoelectronics Research Institute, Chongqing 400060, CHN.

* cited by examiner

[Fig. 1A]
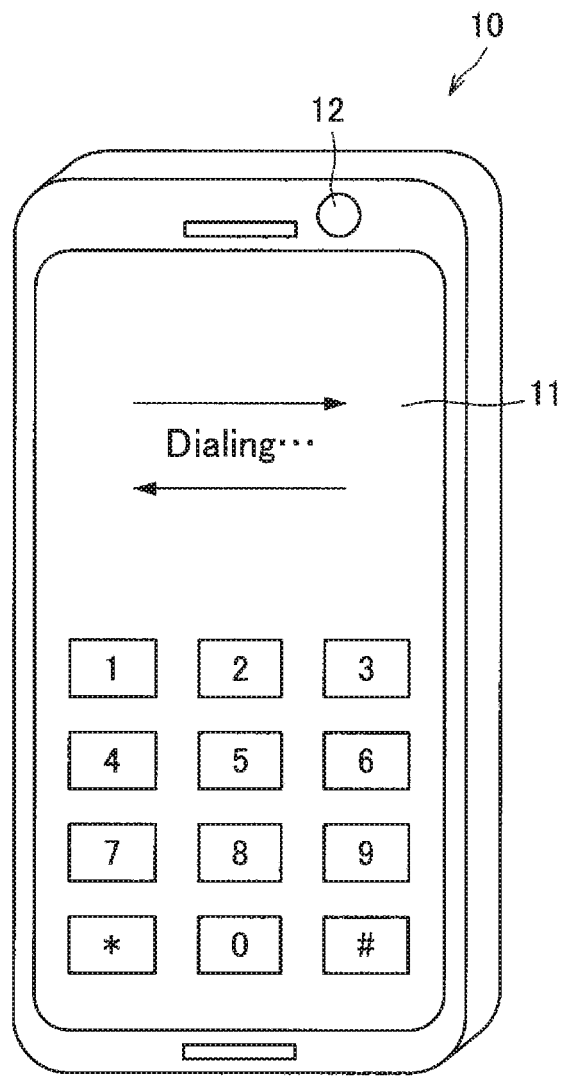

[Fig. 1B]
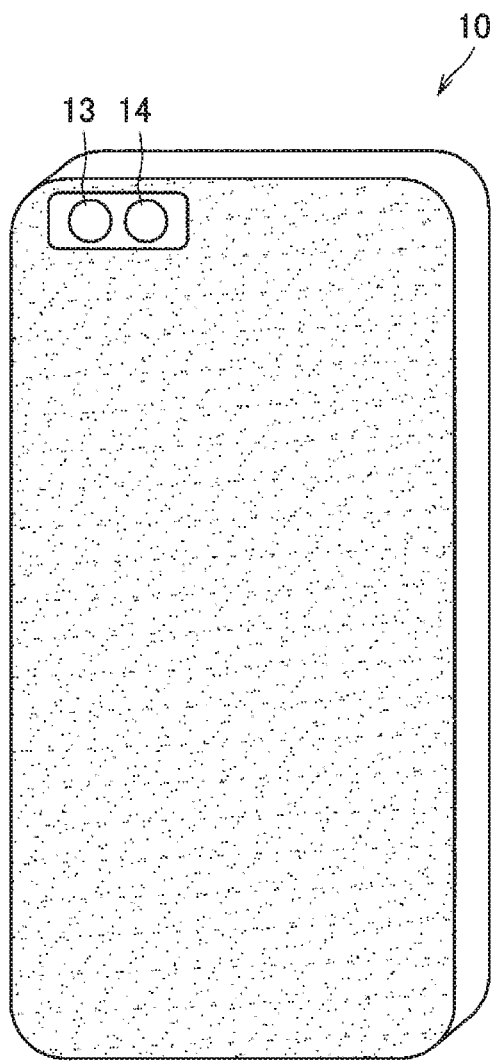

[Fig. 2]
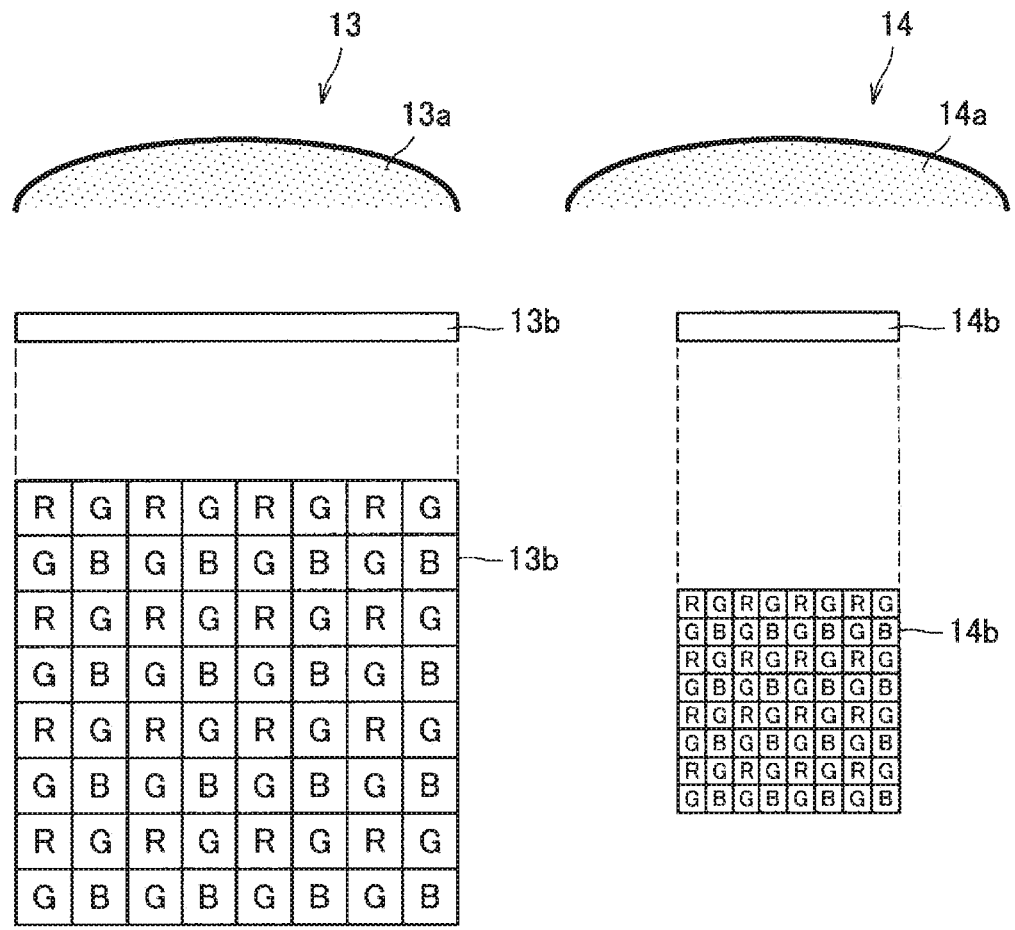
[Fig. 3]
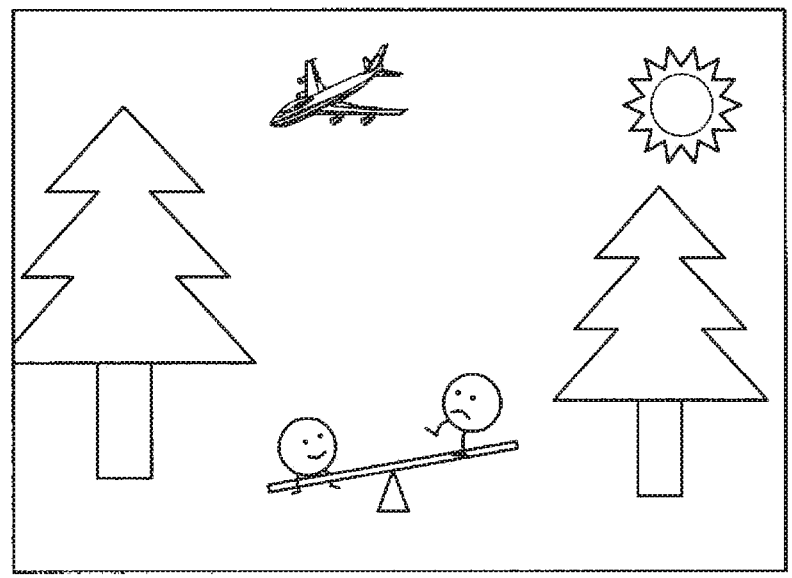

[Fig. 4]
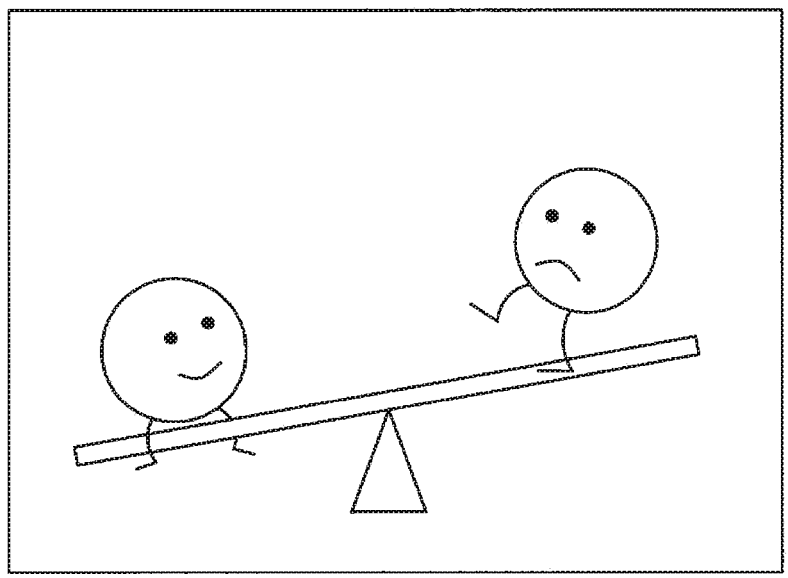
[Fig. 5]
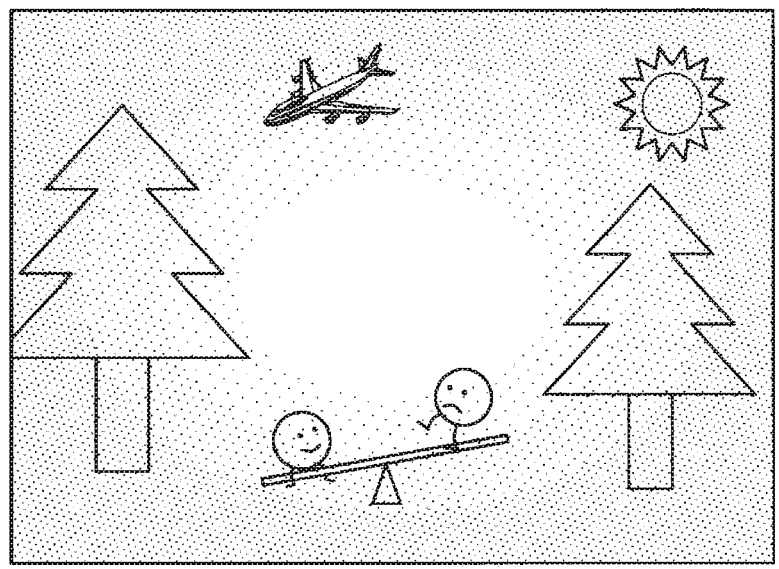

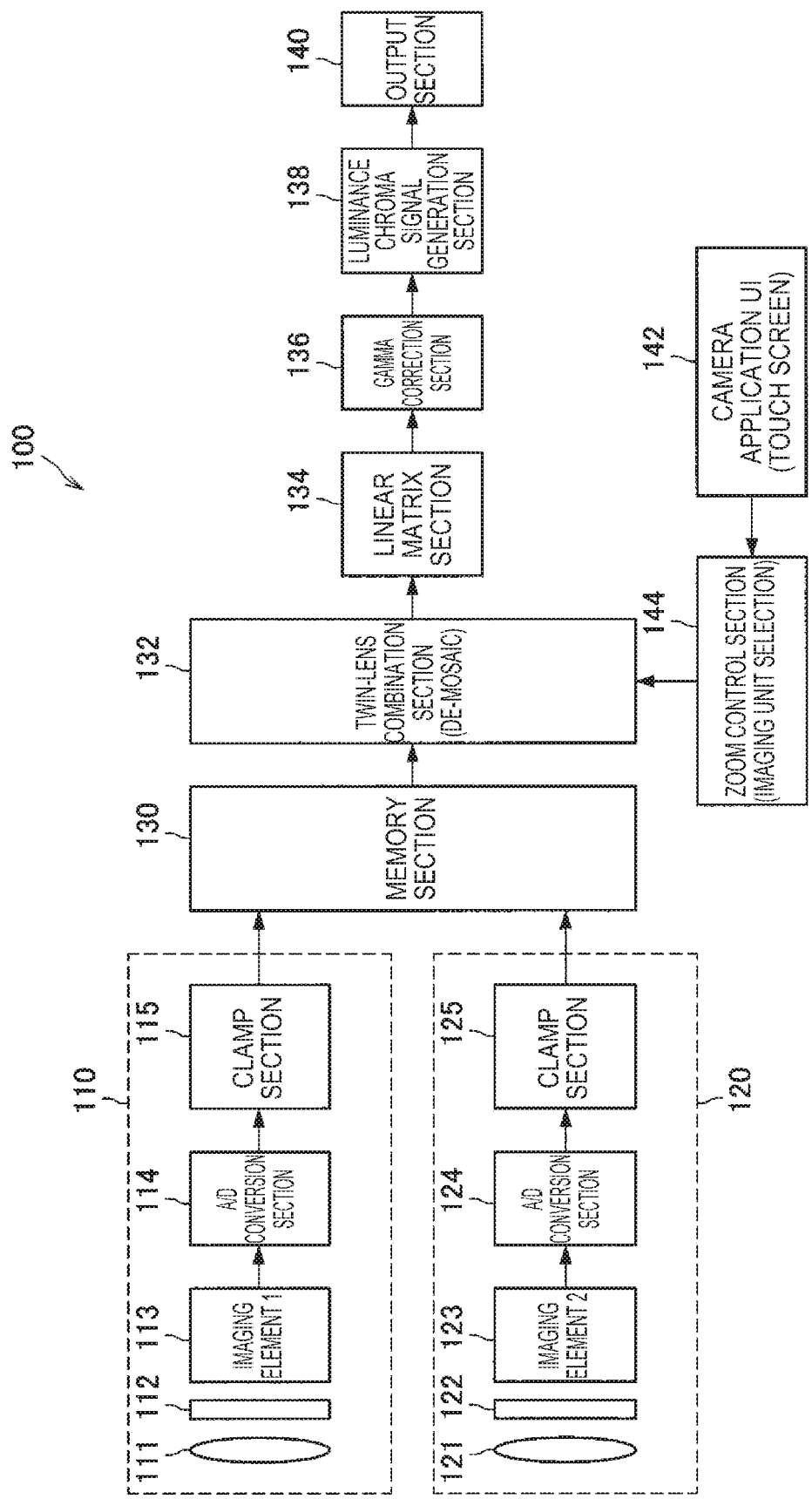
[Fig. 6]

[Fig. 7]
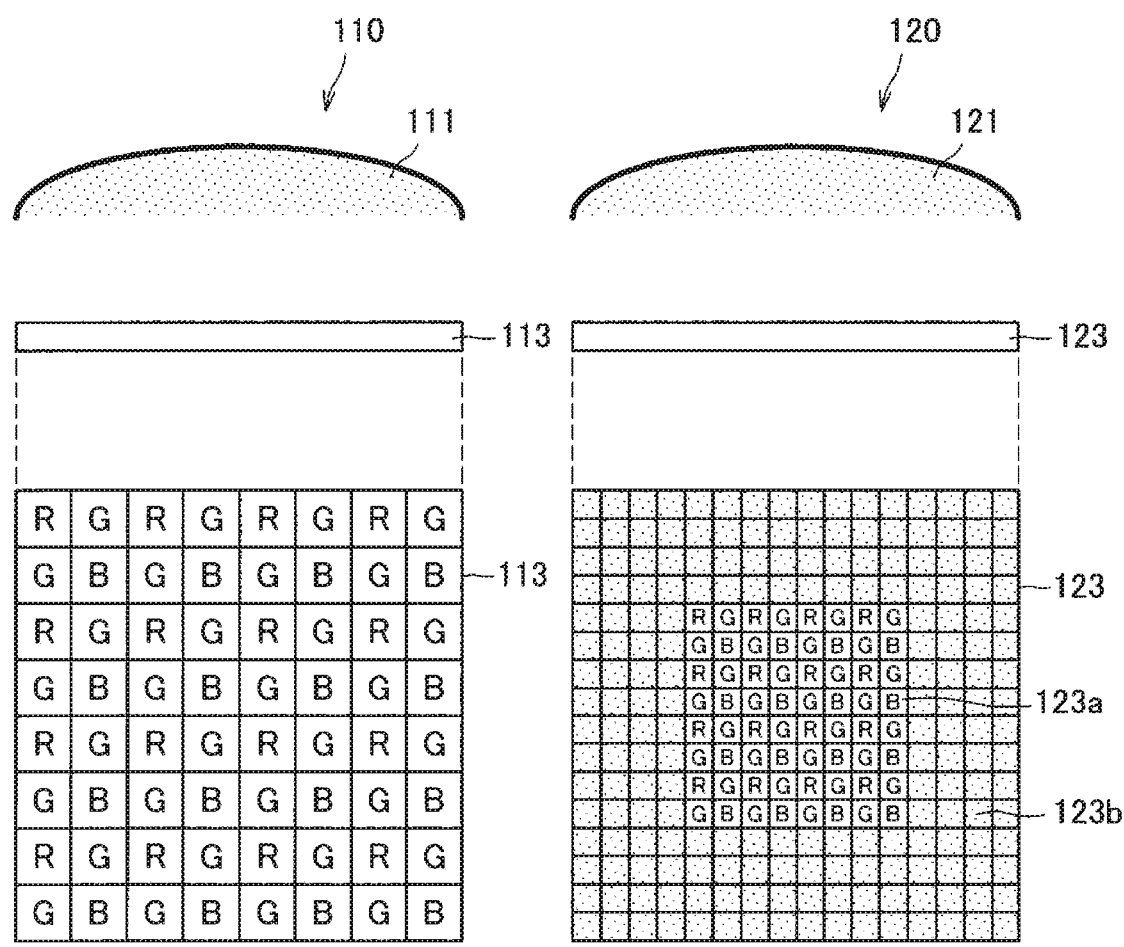

[Fig. 8]
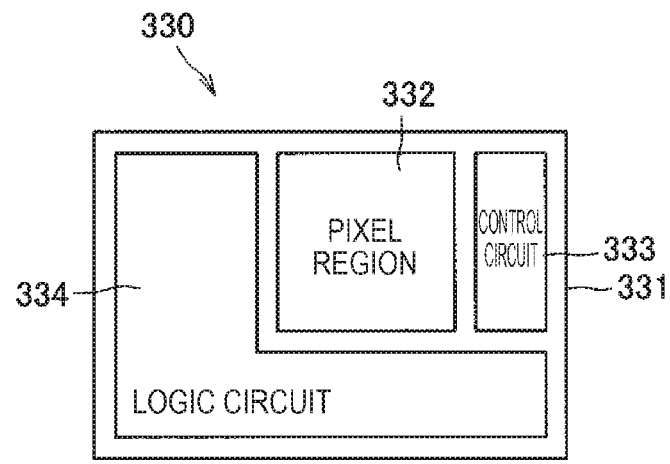
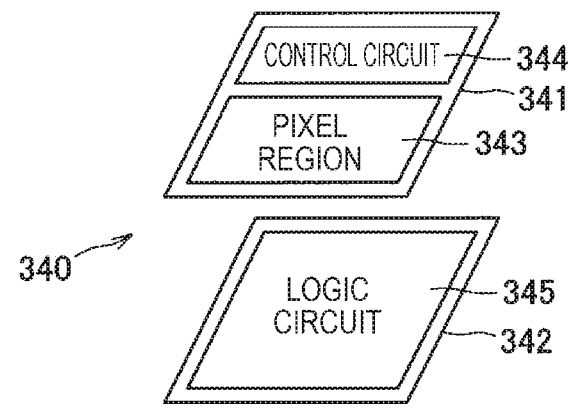
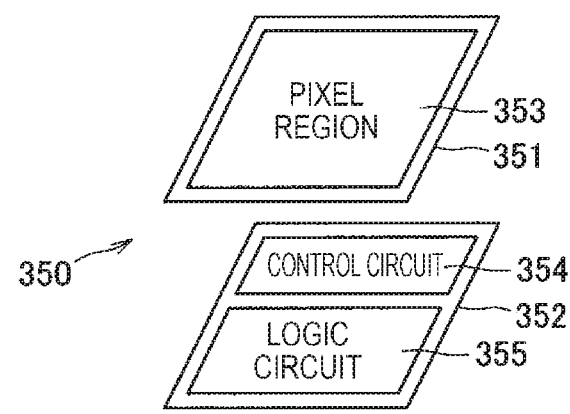

[Fig. 9]
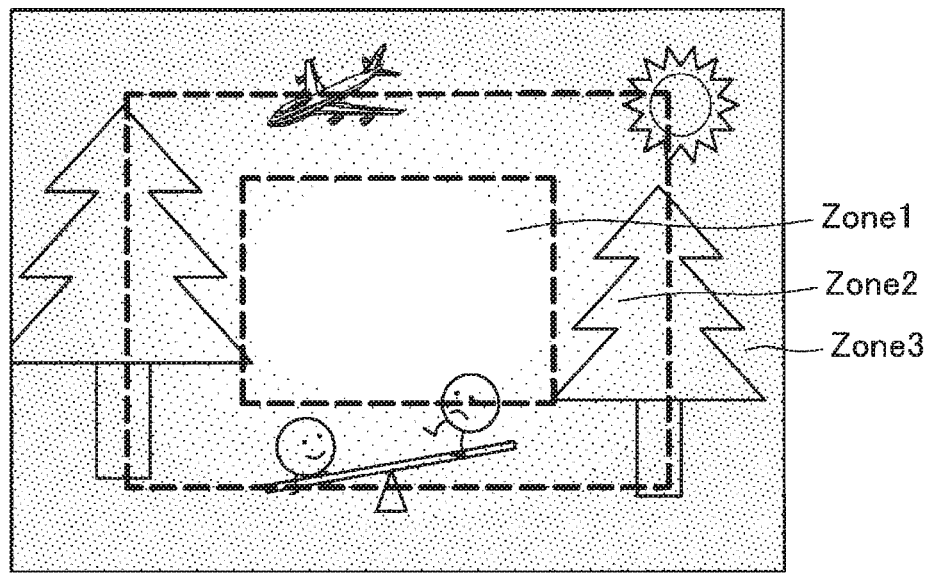
[Fig. 10]
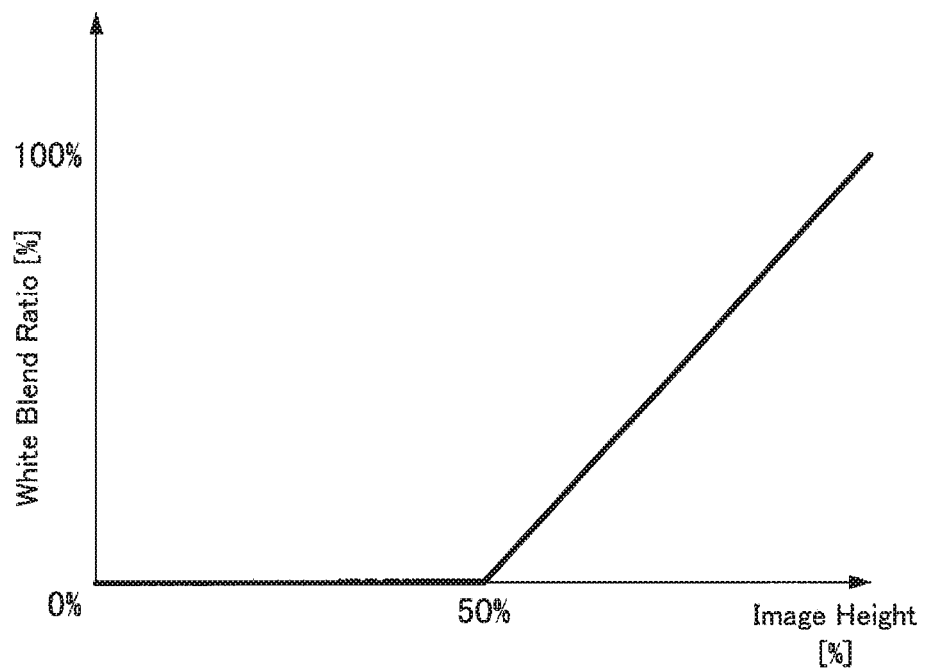

[Fig. 11]
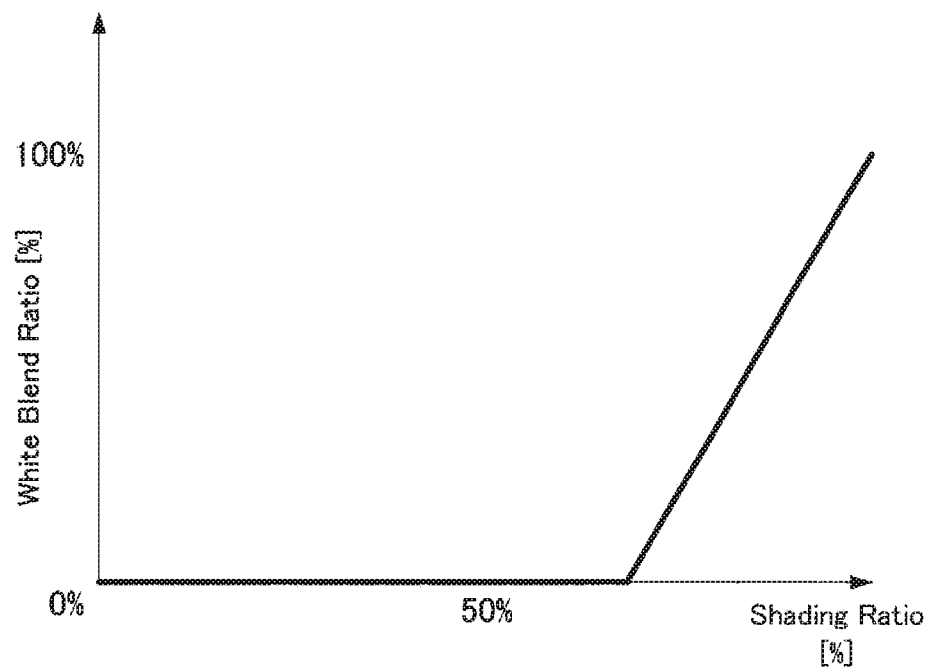
[Fig. 12]

[Fig. 13]
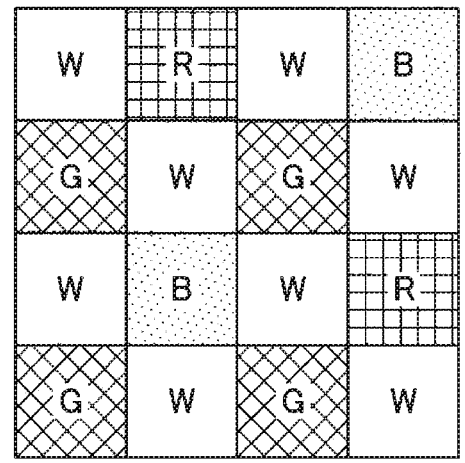
[Fig. 14]
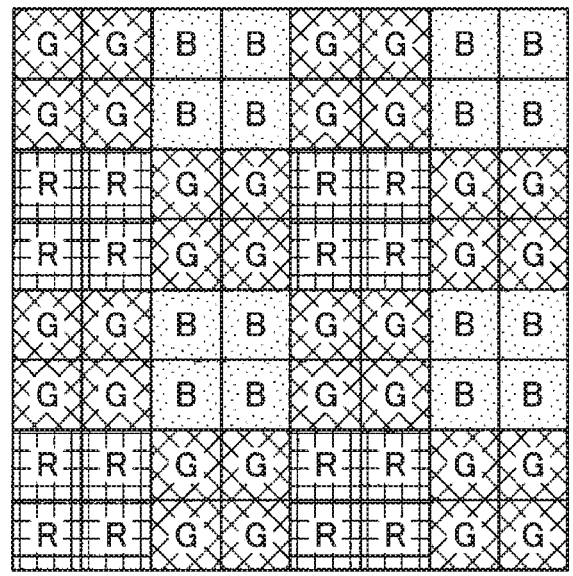

[Fig. 15]
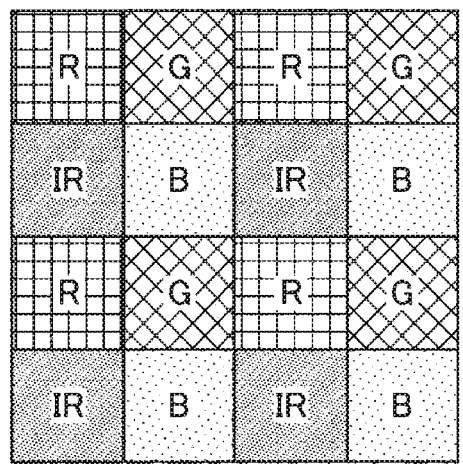
[Fig. 16]
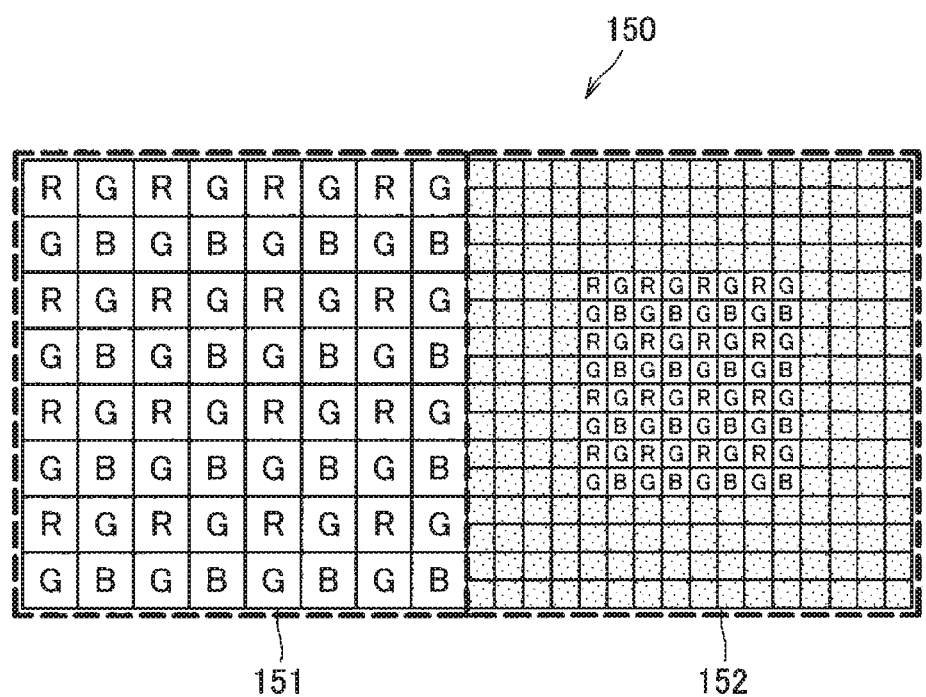

[Fig. 17]
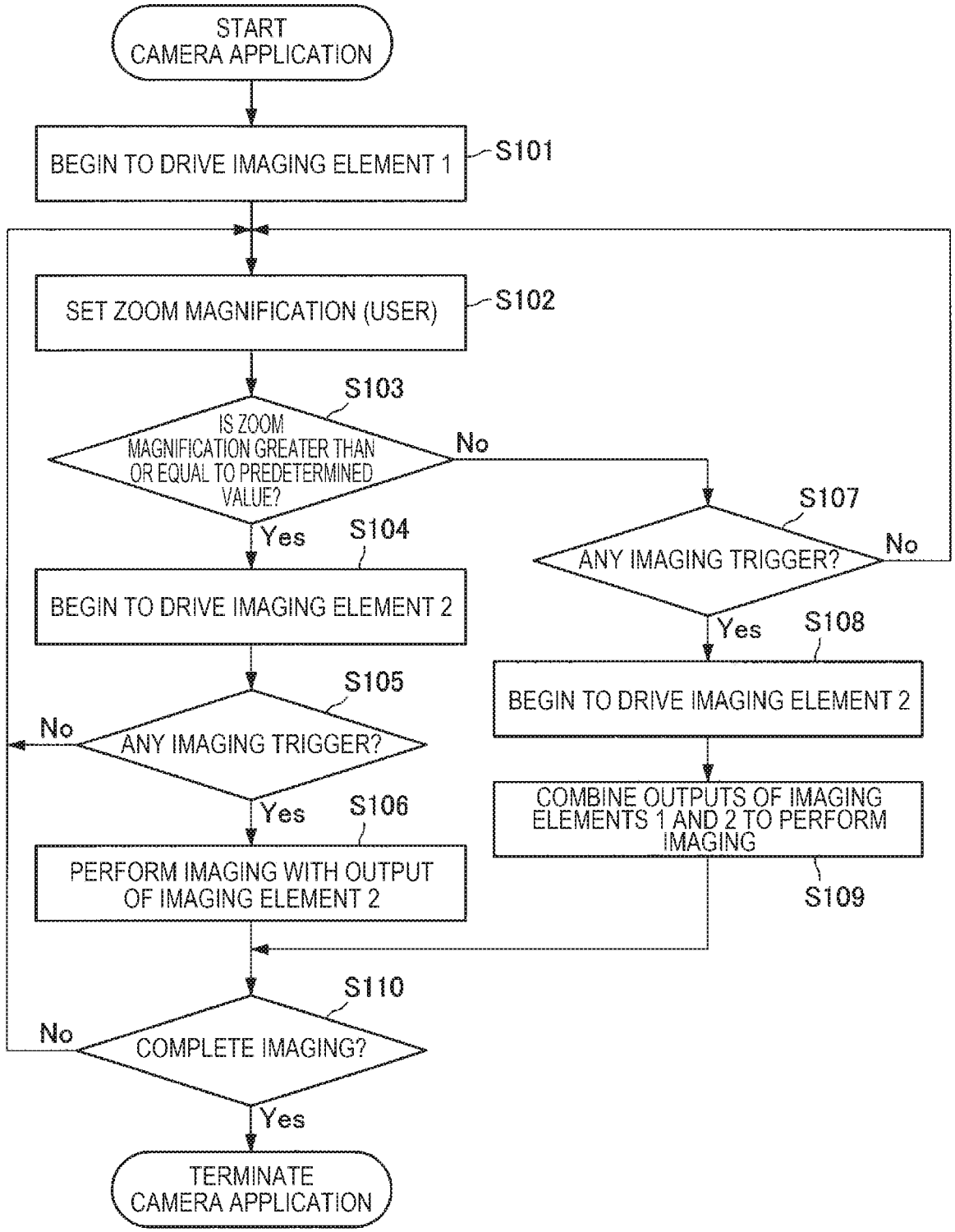

[Fig. 18]
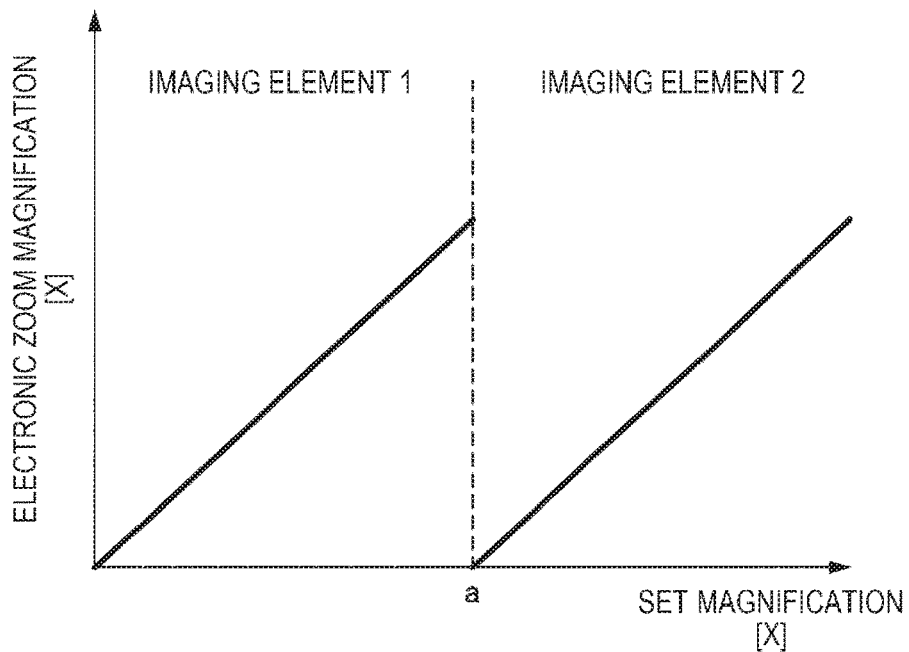
[Fig. 19]
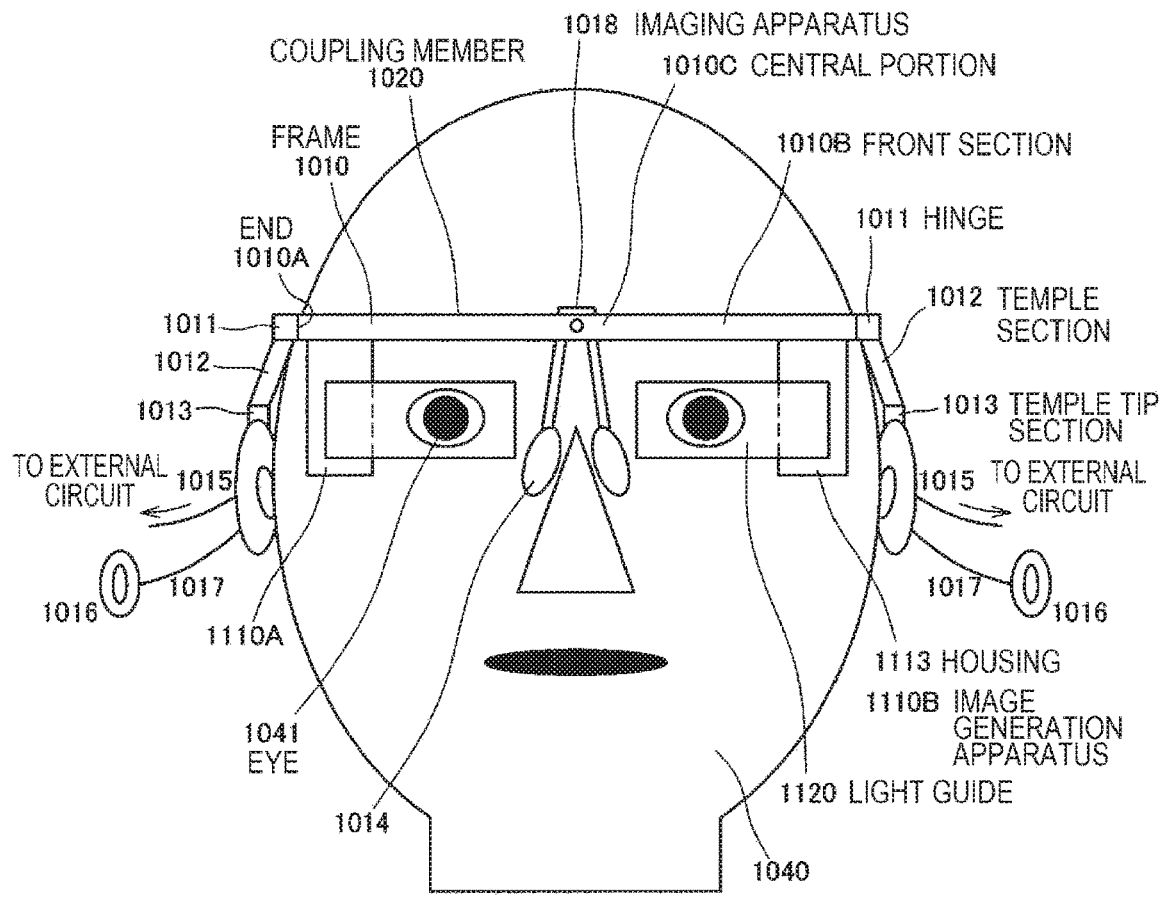

IMAGING APPARATUS

CROSS REFERENCE TO RELATED APPLICATIONS

This application is a national stage application under 35 U.S.C. 371 and claims the benefit of PCT Application No. PCT/JP2018/021868 having an international filing date of 7 Jun. 2018, which designated the United States, which PCT application claimed the benefit of Japanese Priority Patent Application No. 2017-132134 filed on 5 Jul. 2017, the disclosures of each of which are incorporated herein by reference in their entirety.

TECHNICAL FIELD

The present disclosure relates to an imaging apparatus.

BACKGROUND ART

There is technology including a plurality of imaging units to increase imaging magnification while keeping favorable image quality in magnifying and imaging a subject with electronic zoom (see, for example, PTL 1). With electronic zoom, there is no need to use optical zoom, which moves the position of a lens to change the imaging magnification. It is then possible to obtain an enlarged image without increasing the thickness of a thin-structured electronic device such as a smartphone.

CITATION LIST

Patent Literature

PTL 1: JP 2016-34076A

SUMMARY

Technical Problem

There is a technique of zooming in or out by switching a plurality of imaging units. Such a zoom method generally uses only any one of the imaging units to output an image. In the case where this technique is used, there are a plurality of cameras. Accordingly, the use of the outputs from the plurality of cameras is expected to increase image quality.

The present disclosure then proposes a novel and improved imaging apparatus that is capable of increasing the image quality of a captured image by using a plurality of imaging units in performing imaging.

Solution to Problem

According to an embodiment of the present disclosure, there is provided an imaging apparatus including: at least a first imaging element and a second imaging element each configured to perform imaging in a same direction. At least any of the first imaging element or the second imaging element is different in pixel arrangement between a central part and a part other than the central part.

In addition, according to an embodiment of the present disclosure, there is provided an imaging apparatus including: at least a first imaging element and a second imaging element each configured to perform imaging in a same direction. A region of the second imaging element which is a region having substantially a same angle of view as an angle of view of a central part of the first imaging element has same pixel arrangement, and a region of the second imaging element which is a region having substantially a same angle of view as an angle of view of a part other than the central part of the first imaging element has different pixel arrangement.

Advantageous Effects of Invention

As described above, according to an embodiment of the present disclosure, it is possible to provide a novel and improved imaging apparatus that is capable of increasing the image quality of a captured image by using a plurality of imaging units in performing imaging.

Note that the effects described above are not necessarily limitative. With or in the place of the above effects, there may be achieved any one of the effects described in this specification or other effects that may be grasped from this specification.

BRIEF DESCRIPTION OF DRAWINGS

FIG. 1A is an explanatory diagram illustrating an external appearance configuration example of a smartphone 10 including a plurality of imaging units.

FIG. 1B is an explanatory diagram illustrating an external appearance configuration example of the smartphone 10 including a plurality of imaging units.

FIG. 2 is an explanatory diagram illustrating an example of a lens and an imaging element included in a main camera.

FIG. 3 is an explanatory diagram illustrating an example of a subject to be imaged.

FIG. 4 is an explanatory diagram illustrating that some of subjects illustrated in FIG. 3 are magnified by switching the imaging units.

FIG. 5 is an explanatory diagram illustrating an example of shading.

FIG. 6 is an explanatory diagram illustrating a functional configuration example of an imaging apparatus according to an embodiment of the present disclosure.

FIG. 7 is an explanatory diagram illustrating arrangement of pixels of an imaging element according to the embodiment.

FIG. 8 is an explanatory diagram that describes a basic schematic configuration of an imaging element used for the present technology.

FIG. 9 is an explanatory diagram illustrating an overview of combination of images captured by two imaging elements.

FIG. 10 is an explanatory diagram that uses a graph to illustrate an example of a blend ratio corresponding to image height.

FIG. 11 is an explanatory diagram that uses a graph to illustrate an example of a blend ratio corresponding to a shading characteristic.

FIG. 12 is an explanatory diagram illustrating an arrangement example of pixels of the imaging element according to the embodiment.

FIG. 13 is an explanatory diagram illustrating an arrangement example of the pixels of the imaging element according to the embodiment.

FIG. 14 is an explanatory diagram illustrating an arrangement example of the pixels of the imaging element according to the embodiment.

FIG. 15 is an explanatory diagram illustrating an arrangement example of the pixels of the imaging element according to the embodiment.

FIG. 16 is an explanatory diagram illustrating an arrangement example of the pixels of the imaging element according to the embodiment.

FIG. 17 is a flowchart illustrating an operation example of the imaging apparatus according to the embodiment.

FIG. 18 is an explanatory diagram illustrating an example of switching a driven imaging element of the imaging apparatus according to the embodiment in accordance with magnification set by a user.

FIG. 19 is an explanatory diagram illustrating a head-mounted display apparatus.

DESCRIPTION OF EMBODIMENTS

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that the description will be made in the following order.
1. Embodiment of the Present Disclosure
1.1. Background
1.2. Configuration Example
1.3. Operation Example
2. Application Example
3. Conclusion

1. Embodiment of the Present Disclosure

1.1. Background

Before an embodiment of the present disclosure is described in detail, the background of the embodiment of the present disclosure will be described.

The image zoom techniques include optical zoom, which moves a lens to change imaging magnification, and electronic zoom, which cuts out a part of an image to attain the zoom effects by performing image processing. Further, in addition to these techniques, there is technology of switching imaging units to increase imaging magnification while keeping favorable image quality.

FIGS. 1A and 1B are explanatory diagrams each illustrating an external appearance configuration example of a smartphone 10 including a plurality of imaging units. The smartphone 10 illustrated in FIGS. 1A and 1B includes a front camera 12 provided on the surface on which a display 11 is provided, and main cameras 13 and 14 provided on the surface opposite to the surface on which the display 11 is provided. The main cameras 13 and 14 are imaging units used to obtain images having desired imaging magnification according to optical zoom.

FIG. 2 is an explanatory diagram illustrating an example of lenses and imaging elements included in the main cameras 13 and 14. The main camera 13 is an imaging unit used to capture an image on the wide-angle side, and includes a lens 13a and an imaging element 13b having Bayer arrangement. In addition, the main camera 14 is an imaging unit used to capture an image on the telephoto side, and includes a lens 14a and an imaging element 14b having Bayer arrangement.

If the imaging element 13b of the main camera 13, which captures an image on the wide-angle side, is compared with the imaging element 14b of the main camera 14, which captures an image on the telephoto side, the imaging element 14b includes pixels having minuter size. This is because smaller optical size than the optical size made incident by the lens 14a is applied to the imaging element 14b of the main camera 14, and the imaging element 14b of the main camera 14 aims at finely capturing only the light near the optical center. The main camera 14 has a narrower area than that of the main camera 13, but is capable of capturing an image of higher resolution.

FIG. 2 illustrates one each of the lenses 13a and 14a for the sake of simplicity, but two or more lenses may be included. In addition, the lenses 13a and 14a are each illustrated in the same size, but the lenses 13a and 14a may be different lenses. That is, a lens having high zoom magnification (i.e., great focal distance) may be used for the lens 14a.

Examples of images obtained by the main cameras 13 and 14 will be described. FIG. 3 is an explanatory diagram illustrating examples of subjects that are to be imaged by the smartphone 10. In the case where it is desirable to image the whole subjects as illustrated in FIG. 3 at a wide angle, the smartphone 10 uses the main camera 13 to perform imaging. In the case where it is desirable to image a specific subject such as a person or an object in large size, electronic zoom using an image captured by the main camera 13 results in a deteriorated sense of resolution.

Thus, at the timing at which a user operation sets magnification that offers the angle of view at which it is possible to perform imaging with the main camera 14 alone, the smartphone 10 switches to use the main camera 14 for imaging. Although the main camera 14 has a narrower imaging region than that of the main camera 13, the imaging element 14b of the main camera 14 includes more pixels that express the imaging region after zooming in. Thus, in the case of predetermined magnification or higher, the use of the main camera 14 to perform imaging allows the smartphone 10 to capture an image in which deterioration of a sense of resolution is suppressed.

FIG. 4 is an explanatory diagram illustrating that some of the subjects illustrated in FIG. 3 are magnified by switching imaging units. For example, in the case where it is desirable to image people playing on a seesaw in large size with the smartphone 10, the use of the main camera 14 to perform imaging allows the smartphone 10 to capture an image in which deterioration of a sense of resolution is suppressed as illustrated in FIG. 4.

In this way, the smartphone 10 including a plurality of imaging units selects any of the main cameras 13 and 14 in accordance with imaging magnification to perform imaging, which allows deterioration of a sense of image resolution to be suppressed even when capturing an image of high resolution, while increasing the imaging magnification of electronic zoom. Meanwhile, even if a plurality of imaging units are included, it is any one of the main cameras 13 and 14 that is used for imaging. Thus, even if two main cameras are included that have different imaging areas, the two main cameras are not concurrently used for imaging.

In addition, a general imaging apparatus has a larger light incident angle in accordance with the influence of a lens. This causes a phenomenon called shading in the main camera 13 or the like. The shading is a luminance drop caused by decreased light in the peripheral region of an image. By and large, shading can generally happen to every imaging apparatus. FIG. 5 is an explanatory diagram illustrating an example of shading. As illustrated in FIG. 5, outputs are reduced nearer to the outer circumferential region of an image. In general, in an imaging apparatus, shading correction is performed to overcome this shading.

Examples of the shading correction include a technique of performing processing of increasing a gain on the outer circumferential region of an image. However, the outer circumferential region is disadvantaged from the S/N perspective because of a small signal amount. The gain of the outer circumference increased by the shading correction makes noise more conspicuous.

Then, the present discloser has diligently studied the technology capable of increasing the image quality of a captured image by concurrently using, in an imaging apparatus including a plurality of imaging units, the plurality of imaging units. As a result, the present discloser has devised the technology capable of increasing the image quality of a captured image by concurrently using, in an imaging apparatus including a plurality of imaging units, the plurality of imaging units.

The above describes the background of the embodiment of the present disclosure. Next, the embodiment of the present disclosure will be described in detail.

1.2. Configuration Example

FIG. 6 is an explanatory diagram illustrating a functional configuration example of an imaging apparatus 100 according to the embodiment of the present disclosure. FIG. 6 illustrates a functional configuration example of the imaging apparatus 100 including two imaging units like the smartphone 10 used for the description above. The following uses FIG. 6 to describe a functional configuration example of the imaging apparatus 100 according to the embodiment of the present disclosure.

As illustrated in FIG. 6, the imaging apparatus 100 according to the embodiment of the present disclosure includes imaging units 110 and 120, a memory section 130, a twin-lens combination section 132, a linear matrix section 134, a gamma correction section 136, a luminance chroma signal generation section 138, an output section 140, a camera application UI 142, and a zoom control section 144.

The imaging unit 110 is an imaging unit started when an image on the wide-angle side is captured. The imaging unit 110 includes a lens 111, an IR cut filter 112, an imaging element 113, an A/D conversion section 114, and a clamp section 115. The imaging unit 120 is an imaging unit started when an image on the telephoto side is captured. The imaging unit 120 includes a lens 121, an IR cut filter 122, an imaging element 123, an A/D conversion section 124, and a clamp section 125. In addition, not only when an image on the telephoto side is captured, but also when an image on the wide-angle side is captured, the imaging unit 120 is started to increase the image quality of the image on the wide-angle side.

The imaging element 113 is irradiated with the light passing through the lens 111 and the IR cut filter 112, which cuts an infrared region. The imaging element 113 is, for example, a CMOS image sensor. A plurality of unit pixels (which will be referred to simply as "pixels" in some cases) are two-dimensionally disposed in a matrix manner. The imaging element 113 is not limited to a CMOS image sensor. The respective unit pixels include color filters, for example, in Bayer arrangement.

Similarly, the imaging element 123 is irradiated with the light passing through the lens 121 and the IR cut filter 122. The imaging element 123 is, for example, a CMOS image sensor, and a plurality of pixels are two-dimensionally disposed in a matrix manner. The imaging element 123 is not limited to a CMOS image sensor. The respective unit pixels include color filters, for example, in Bayer arrangement.

The signals of the pixels output from the imaging element 113 are converted from analog signals to digital signals by the A/D conversion section 114. Similarly, the signals of the pixels output from the imaging element 123 are converted from analog signals to digital signals by the A/D conversion section 124. These kinds of data are supplied to the memory section 130 after the clamp sections 115 and 125 perform black-level correction processing thereon. Here, the imaging elements 113 and 123 may have the A/D conversion sections built therein.

The memory section 130 includes, for example, a frame memory. The memory section 130 stores the data output from the imaging elements 113 and 123 in units of rows (lines) of pixels arranged in a matrix manner, or in units of frames. This memory section 130 includes a memory control section (not illustrated) that controls the frame memory. The memory section 130 writes or reads data in the frame memory under the control of the memory control section.

The twin-lens combination section 132 performs processing of combining the data output from the imaging elements 113 and 123. The twin-lens combination section 132 also performs de-mosaic processing in addition to the combination of data. The linear matrix section 134 performs color reproduction processing on the output data from the twin-lens combination section 132. The gamma correction section 136 performs gamma correction processing on the output data from the linear matrix section 134. The luminance chroma signal generation section 138 generates luminance signals and chroma signals for the output data from the gamma correction section 136. The output section 140 outputs the output data from the luminance chroma signal generation section 138 to the outside (e.g., display or the like).

The magnification at the time of imaging is set by a user operating the camera application UI 142 displayed on a touch screen that is not illustrated. The zoom control section 144 selects an imaging unit to be driven on the basis of information of the magnification set by the camera application UI 142.

The imaging element 113 includes a color filter having Bayer arrangement like the imaging element 13b in FIG. 2. Meanwhile, the imaging element 123 has a high-sensitive pixel group disposed around high-definition pixels for increasing the capability of color separation like the imaging element 14b in FIG. 2. The pixels of the imaging element 123 are minuter than the pixels of the imaging element 113.

FIG. 7 is an explanatory diagram illustrating the arrangement of the pixels of the imaging elements 113 and 123 according to the embodiment of the present disclosure. The imaging elements 113 and 123 are both manufactured in such size that allows the imaging elements 113 and 123 to perform imaging at substantially the same angle of view. In the present embodiment, the imaging element 123, which captures an image on the telephoto side, is then configured to have a high-sensitive pixel group 123b disposed around pixels 123a having Bayer arrangement. The high-sensitive pixel group is a set of pixels capable of performing imaging with higher sensitivity than the pixels 123a doing when white light is incident. For example, as described below, the high-sensitive pixel group is a pixel group having arrangement including pixels that are all white or arrangement including pixels some of which are white.

That is, the pixels 123a of the imaging element 123 which have substantially the same angle of view as the angle of view of the central part of the pixels of the imaging element 113 have the same arrangement (Bayer arrangement). In the same region as a region other than the angle of view of the central part of the pixels of the imaging element 113, the imaging element 123 has the high-sensitive pixel group 123b disposed.

In this way, the imaging element 113 having Bayer arrangement as a whole and the imaging element 123 partially having a high-sensitive pixel group image the same subject, thereby allowing the imaging apparatus 100 to increase the image quality when capturing an image on the wide-angle side.

The pixels 123a of the imaging element 123, which have the same angle of view as the angle of view of the central part the pixels of the imaging element 113, may have the same arrangement. However, for example, the pixels 123a having the same arrangement as that of the pixels of the imaging element 113 may be provided in an area that is one pixel greater than the angle of view of the central part of the pixels of the imaging element 113. In a portion where general RGB pixels are adjacent to white pixels, the increased outputs of pixel data can cause mixed colors. Thus, in electronic zoom, the output of the imaging element 113 and the output of the imaging element 123 may be switched at the time of the magnification corresponding the periphery that one pixel smaller than that of the pixels 123a of the central part of the imaging element 123.

In the present embodiment, the example of the imaging apparatus 100 including the two imaging units 110 and 120 has been shown. However, the present disclosure is not limited to the example. There may be provided three or more imaging units to the imaging apparatus 100 to increase the magnification of electronic zoom.

Here, with reference to FIG. 8, the basic schematic configuration of an imaging element used for the present technology will be described.

As a first example of an imaging element used for the present technology, a solid-state imaging apparatus 330 illustrated in the upper part of FIG. 8 includes a pixel region 332, a control circuit 333, and a logic circuit 334 in one semiconductor chip 331. The logic circuit 334 can include, for example, the twin-lens combination section 132 illustrated in FIG. 6.

As a second example of an imaging element used for the present technology, a solid-state imaging apparatus 340 illustrated in the middle of FIG. 8 includes a first semiconductor chip section 341 and a second semiconductor chip section 342. The first semiconductor chip section 341 is equipped with a pixel region 343 and a control circuit 344. The second semiconductor chip section 342 is equipped with a logic circuit 345. The first semiconductor chip section 341 is then electrically connected to the second semiconductor chip section 342, constituting the solid-state imaging apparatus 340 as one semiconductor chip. The logic circuit 345 can include, for example, the twin-lens combination section 132 illustrated in FIG. 6.

As a third example of an imaging element used for the present technology, a solid-state imaging apparatus 350 illustrated in the lower part of FIG. 8 includes a first semiconductor chip section 351 and a second semiconductor chip section 352. The first semiconductor chip section 351 is equipped with a pixel region 353. The second semiconductor chip section 352 is equipped with a control circuit 354 and a logic circuit 355. The first semiconductor chip section 351 is then electrically connected to the second semiconductor chip section 352, constituting the solid-state imaging apparatus 350 as one semiconductor chip. The logic circuit 355 can include, for example, the twin-lens combination section 132 illustrated in FIG. 6.

Next, the overview of combination of images captured by the imaging elements 113 and 123 will be described. FIG. 9 is an explanatory diagram illustrating the overview of combination of images captured by the imaging elements 113 and 123. The region imaged by both the pixels of the imaging element 113 and the pixels 123a other than the high-sensitive pixel group 123b of the imaging element 123 is referred to as Zone 1. The regions imaged by both the pixels of the imaging element 113 and the high-sensitive pixel group 123b of the imaging element 123 are referred to as Zone 2 and Zone 3 from the inner side.

The Zone 1 is the region at the center (near the optical center) of an image, and is less affected by shading. Thus, the twin-lens combination section 132 outputs the output as made by the imaging element 113 for the region of the Zone 1.

Meanwhile, the region of the Zone 3 is the peripheral region of an image, and is considerably affected by shading. The SN ratio of the output from the imaging element 113 decreases. Thus, the twin-lens combination section 132 combines the output from the imaging element 113 with the output from the imaging element 123 which is imaged with high sensitivity to complement the output from the imaging element 113 for the region of the Zone 3. The twin-lens combination section 132 combines the outputs of the imaging elements 113 and 123, for example, with a technique of using the white pixels of the imaging element 123 as luminance (Y) signals, and the color pixels of the imaging element 113 as color (C) signals. Examples of the technology of using white pixels to increase the SN ratio include the technology described in JP 2012-85334A of the Applicant of the present application.

Note that FIG. 9 defines each region with a rectangular shape, but the present disclosure is not limited to the example. Shading concentrically occurs from the center of an image, and the Zones 1 to 3 may be thus each defined with a circular shape.

In the present embodiment, the two imaging units 110 and 120 are located at physically different positions, so that disparity occurs. Thus, the twin-lens combination section 132 may adjust a combination portion by generating luminance signals in each of the two imaging units 110 and 120 and matching the luminance signals. The adjusted combination portion makes an image combined by the twin-lens combination section 132 look more natural.

In this way, the imaging apparatus 100 according to the embodiment of the present disclosure performs combination processing in a region imaged by the pixels of the imaging element 113 and the high-sensitive pixel group 123b of the imaging element 123, thereby making it possible to increase the image quality of the peripheral region of the captured image. Here, a difference in image quality can occur between the region that is combined with the data output from the high-sensitive pixel group 123b and the region that is not combined with the data is not combined, and cause visual strangeness.

Then, the twin-lens combination section 132 may perform combination in the region of the Zone 2 between the region of the Zone 1 and the region of the Zone 3 with less contribution of the high-sensitive pixel group than in the Zone 3. At this time, the twin-lens combination section 132 may change the blend ratio of the data of the high-sensitive pixel group 123b in accordance with the image height. FIG. 10 is an explanatory diagram that uses a graph to illustrate an example of the blend ratio of the data of the high-sensitive pixel group 123b corresponding to image height. In the graph of FIG. 10, the horizontal axis represents image height and the vertical axis represents the blend ratio of the data of the high-sensitive pixel group 123b. Note that image height is shown in percentages. As illustrated in the graph of FIG. 10, for example, in the case where the high-sensitive pixel group 123b is disposed with an image height of 50% or higher, the output as made by the pixel group 113 is output before an image height of 50%. However, once an image height of 50% is exceeded, the blend ratio of the data of the high-sensitive pixel group 123b increases in proportion to an increase in the image height.

In addition, the twin-lens combination section 132 may change the blend ratio of the data of the high-sensitive pixel group 123b in accordance with the shading characteristics of the lens 111 and the imaging element 113 which are obtained in advance at the time of design or the like. FIG. 11 is an explanatory diagram that uses a graph to illustrate an example of the blend ratio of the data of the high-sensitive pixel group 123b corresponding to shading characteristics. In the graph of FIG. 11, the horizontal axis represents shading characteristics and the vertical axis represents the blend ratio of the data of the high-sensitive pixel group 123b. Note that shading characteristics are shown in percentages. As illustrated in the graph of FIG. 11, the high-sensitive pixel group 123b is not used at all before the shading characteristics reach approximately 75%. However, once the shading characteristics exceed approximately 75%, the blend ratio of the data of the high-sensitive pixel group 123b increases in proportion to an increase in the shading characteristics.

Next, an arrangement example of the pixels of the imaging elements 113 and 123 will be described. As described above, the pixels of the high-sensitive pixel group 123b of the imaging element 123 may be all white, or some of the pixels may be white. FIG. 12 is an explanatory diagram illustrating an arrangement example of the pixels of the imaging element 123. FIG. 12 illustrates an example in which the pixels of the high-sensitive pixel group 123b are all white. FIG. 13 is an explanatory diagram illustrating an arrangement example of the pixels of the imaging element 123. FIG. 13 illustrates an example in which some of the pixels of the high-sensitive pixel group 123b are white, and general RGB pixels are disposed as the remaining pixels.

In addition, in the above-described example, it is described that the imaging element 123 rather than the imaging element 113 uses higher-definition pixels. However, the present disclosure is not limited to the example. As pixels having the same size in the imaging elements 113 and 123, the imaging element 113 may have arrangement with two pixels in height by two pixels in width in the same color. FIG. 14 is an explanatory diagram illustrating an arrangement example of the pixels of the imaging element 113. FIG. 14 illustrates an arrangement example in which the pixels of the imaging element 113 have arrangement with two pixels in height by two pixels in width in the same color. Such arrangement of the pixels of the imaging element 113 with two pixels in height by two pixels in width in the same color offers the higher color separation capability of the imaging element 123 near the optical center than that of the imaging element 113. In addition, such arrangement with two pixels in height by two pixels in width in the same color allows each pixel to change the amount of exposure such as shutter time and widen the dynamic range, for example, like the technology described in JP 2012-28423A of the Applicant of the present application.

The imaging element 123 may be made multispectral by providing a pixel disposed in the high-sensitive pixel group 123b with not a white pixel, but, for example, an IR pixel that detects IR light. FIG. 15 is an explanatory diagram illustrating an arrangement example of the pixels of the imaging element 123. FIG. 15 illustrates an example in which not a white pixel, but, for example, an IR pixel that detects IR light is disposed at a pixel disposed in the high-sensitive pixel group 123b. Disposing an IR pixel in this way allows various kinds of information to be identified with the data output from the imaging element 123. For example, it is possible to identify an object with the data output from the imaging element 123. In addition, for example, it is possible to identify indoor light and sunlight with the data output from the imaging element 123. In addition, disposing an IR pixel also allows various light sources in a room to be identified with the data from the imaging element 123. Note that a pixel disposed in the high-sensitive pixel group 123b is not limited to the IR pixel. A pixel having a color such as yellow or cyan other than RGB may be disposed in the high-sensitive pixel group 123b.

Note that pixels disposed in the high-sensitive pixel group 123b of the imaging element 123 may include any one of a white pixel or an IR pixel, or both a white pixel and an IR pixel.

The above shows the example in which the imaging elements 113 and 123 are formed as different entities, but the present disclosure is not limited to the example. That is, on the same silicon substrate, an imaging element on which a region in which pixels having general Bayer arrangement are disposed, and a region in which high-definition pixels having Bayer arrangement and a high-sensitive pixel group are disposed are formed may be used. FIG. 16 is an explanatory diagram illustrating an arrangement example of the pixels of the imaging element 150 according to the embodiment of the present disclosure. In this way, using an imaging element having a region 151 in which pixels having general Bayer arrangement are disposed, and a region 152 in which high-definition pixels having Bayer arrangement and a high-sensitive pixel group are disposed, the twin-lens combination section 132 may perform the combination processing as described above on images. Note that, in this case, there are provided two lenses onto the front surface of the imaging element 150 to make light incident on each of the regions 151 and 152.

1.3. Operation Example

Next, an operation example of the imaging apparatus 100 according to the embodiment of the present disclosure will be described. FIG. 17 is a flowchart illustrating an operation example of the imaging apparatus 100 according to the embodiment of the present disclosure. FIG. 17 illustrates an operation example of the imaging apparatus 100 in which imaging processing according to electronic zoom is performed with the two imaging units 110 and 120. The following uses FIG. 17 to describe an operation example of the imaging apparatus 100 according to the embodiment of the present disclosure.

Once a camera application is started by a user in the imaging apparatus 100, the imaging apparatus 100 first begins to drive the imaging element 113 (which is referred to as "imaging element 1" in FIG. 17) of the imaging unit 110 (step S101).

When the user uses the camera application UI 142 to set zoom magnification (step S102), the imaging apparatus 100 determines whether or not the magnification set by the user is greater than or equal to a predetermined value (step S103).

The determination processing in step S103 may be executed, for example, by the zoom control section 144.

FIG. 18 is an explanatory diagram illustrating an example of switching a driven imaging element of the imaging apparatus 100 according to the embodiment of the present disclosure in accordance with magnification set by a user. In the present embodiment, before the set magnification reaches a magnification of a, the imaging element 113 (which is referred to as "imaging element 1" in FIG. 18) is used to perform electronic zoom processing. After the set magnification exceeds a magnification of a, the imaging element 123 (which is referred to as "imaging element 2" in FIG. 18) is used to perform electronic zoom processing. The determination processing in step S103 of FIG. 17 is determining whether or not this magnification set by the user exceeds a magnification of a.

If a result of the determination in step S103 shows that the magnification set by the user is greater than or equal to the predetermined value (step S103, Yes), the imaging apparatus 100 begins to drive the imaging element 123 (which is referred to as "imaging element 2" in FIG. 17) of the imaging unit 120 (step S104). The imaging apparatus 100 then determines whether or not the user pulls an imaging trigger (e.g., operates an imaging button displayed by the camera application UI 142, pushes down the shutter button provided to the imaging apparatus 100, etc.) (step S105). If the imaging trigger is pulled (step S105, Yes), the imaging apparatus 100 uses the output of the imaging element 123 to perform imaging (step S106). If the imaging trigger is not pulled (step S105, No), the imaging apparatus 100 returns to the processing in step S102 above.

In contrast, if a result of the determination in step S103 shows that the magnification set by the user is not greater than or equal to the predetermined value (step S103, No), the imaging apparatus 100 determines whether or not the user pulls an imaging trigger (e.g., operates an imaging button displayed by the camera application UI 142, pushes down the shutter button provided to the imaging apparatus 100, etc.) (step S107).

If a result of the determination in step S107 shows that the imaging trigger is pulled (step S107, Yes), the imaging apparatus 100 begins to drive the imaging element 123 (step S108), and combines the outputs of the imaging elements 113 and 123 to perform imaging (step S109). The outputs of the imaging elements 113 and 123 are combined, for example, by the twin-lens combination section 132. The imaging apparatus 100 may change the combination ratio for each region of an image as described above in performing combination.

Note that, in the flowchart illustrated in FIG. 17, the imaging element 123 is started when the imaging element 113 performs imaging. However, the imaging apparatus 100 may start not only the imaging element 113, but also the imaging element 123 in advance in step S101 above.

Once performing imaging in step S106 or step S109 above, the imaging apparatus 100 determines whether or not imaging is completed (step S110). In the case of a still image, imaging is completed in accordance with one imaging trigger. For example, in the case where a video is captured or a plurality of images are captured to generate a high-dynamic-range (HDR) image, it is determined according to this processing in step S110 whether imaging is completed. If imaging is completed (step S110, Yes), the imaging apparatus 100 terminates the camera application. If imaging is not completed (step S110, No), the imaging apparatus 100 returns to the processing in step S102 above.

The imaging apparatus 100 according to the embodiment of the present disclosure executes the above-described series of operations to perform imaging with the imaging element 123 as well when performing imaging with the imaging element 113 in the area to predetermined zoom magnification, and combines the output data from the imaging elements 113 and 123. The imaging apparatus 100 according to the embodiment of the present disclosure is capable of increasing the image quality of the peripheral part of an image by combining the output data from the imaging elements 113 and 123.

In the present embodiment, the example has been shown in which an imaging element that uses a color filter is used. However, the present disclosure is not limited to the example. For example, the present disclosure is similarly applicable to an imaging element that uses an organic photoelectric conversion film. The use of an imaging element including an organic photoelectric conversion film makes it possible to obtain an image of higher resolution including color separation in the vertical direction, for example, like the technology described in JP 2011-29337A of the Applicant of the present application.

In the present embodiment, the output as made by the imaging element 113 is used for the central portion (Zone 1 in FIG. 9) of an image in the area to predetermined magnification. However, the present disclosure is not limited to the example. The central portion of an image also includes signals output from the imaging element 123, so that the output of the imaging element 113 may be combined with the output of the imaging element 123. The pixels 123a of the imaging element 123 corresponding to the central portion of an image are not pixels of high sensitivity, so that it is not possible to expect as high an effect as those expected in the peripheral portions (Zones 2 and 3 in FIG. 9). However, it is possible to expect that combining a plurality of pieces of data improves the SN ratio.

In addition, the present disclosure is not limited to the arrangement of the pixels of the imaging element 123 in FIG. 7. There may be a region partially including high-sensitive pixels (white pixels), for example, as illustrated in FIG. 13 between a region of the pixels 123a having general Bayer arrangement and a region of the high-sensitive pixel group 123b.

2. Application Example

The imaging apparatus 100 according to the present embodiment can be used for various apparatuses. For example, the imaging apparatus 100 according to the present embodiment can also be included in a head-mounted display apparatus (i.e., head-mounted display).

FIG. 19 is an explanatory diagram illustrating a head-mounted display apparatus. The head-mounted display apparatus illustrated in FIG. 19 includes image generation apparatuses 1110A and 1110B, and see-through (semi-transmissive) light guides 1120 that are attached to the image generation apparatuses 1110A and 1110B. The light emitted from the image generation apparatuses 1110A and 1110B is incident on and guided to the light guides 1120, and emitted to eyes 1041 of an observer 1040. The whole image generation apparatuses 1110A and 1110B are housed in housings 1113.

A frame 1010 includes a front section 1010B that is disposed in front of the observer 1040, two temple sections 1012 that is pivotably attached to both ends of the front section 1010B via hinges 1011, and temple tip sections (which are also referred to as temple tips, earpieces, or ear pads) 13 that are attached to the tip parts of the respective temple sections 1012. A coupling member 1020 is attached to a central portion 1010C (corresponding to the bridge portion of general glasses) of the front section 1010B which is positioned between the two eyes 1041 of the observer 1040. A nose pad 1014 is then attached onto the side of the coupling member 1020 facing the observer 1040. The frame 1010 and the coupling member 1020 include metal or plastics. The coupling member 1020 is shaped into a curved stick.

Moreover, a wire (such as a signal line or a power line) 1015 extending from the image generation apparatus 1110A extends from the tip parts of the temple tip sections 1013 to the outside via the inside of the temple sections 1012 and the temple tip sections 1013. Moreover, each of the image generation apparatuses 1110A and 1110B includes a headphone section 1016. A headphone section wire 1017 extending from each of the image generation apparatuses 1110A and 1110B extends from the tip parts of the temple tip sections 1013 to the headphone sections 1016 via the inside of the temple sections 1012 and the temple tip sections 1013. More specifically, the headphone section wire 1017 extends from the tip parts of the temple tip sections 1013 to the headphone sections 1016 through the back sides of the ear pinnae (auricles). Such a configuration eliminates the impression that the headphone sections 1016 and the headphone section wire 1017 are disorderly disposed, but can make a neat head-mounted display. Note that a reference numeral 1012a represents cover members of the temple sections. Reference numerals 1013a and 1013b represent temple tip section components. With screws 1013c, the temple tip section components 1013a and 1013b are assembled.

In addition, an imaging apparatus 1018 including a solid-state imaging element including a CCD or a CMOS sensor and a lens (which are not illustrated) is attached to the central portion 1010C of the front section 1010B. Specifically, the central portion 1010C has a through-hole. The portion of the coupling member 1020 facing the through-hole of the central portion 1010C has a concave section. The imaging apparatus 1018 is disposed in this concave section. The light coming from the through-hole of the central portion 1010C is condensed by the lens on the solid-state imaging element. The signals from the solid-state imaging element are sent to the image generation apparatus 1110A via the wire (not illustrated) extending from the imaging apparatus 1018. Note that the wire extending from the imaging apparatus 1018 is connected to the image generation apparatus 1110A through between the coupling member 1020 and the front section 1010B. Such a configuration makes the imaging apparatus difficult to visually recognize as being incorporated into the head-mounted display.

Providing such a head-mounted display with the imaging apparatus 100 according to the present embodiment which includes a plurality of imaging units makes it possible to obtain a captured image of high quality.

Here, the three apparatuses have been shown as an application example. However, the apparatus to which the imaging apparatus 100 according to the embodiment of the present disclosure is applied is not limited to the example. For example, the imaging apparatus 100 according to the embodiment of the present disclosure can also be applied to a head-mounted display device used to allow a user to experience virtual reality (VR) or augmented reality (AR), a single-lens reflex camera, a television camera, and the like.

3. Conclusion

As described above, according to the embodiment of the present disclosure, it is possible to provide the imaging apparatus 100 including a plurality of imaging units, the imaging apparatus 100 being capable of increasing the image quality of a captured image by concurrently using the plurality of imaging units.

The respective steps in the processing executed by each apparatus described herein do not necessarily have to be performed chronologically in the order described in a sequence diagram or a flowchart. For example, the respective steps in the processing executed by each apparatus may be performed in order different from the order described in the flowcharts, or may be performed in parallel.

It is also possible to fabricate a computer program for causing hardware such as the CPU, ROM, and RAM built in each apparatus to implement the same functions as those of the structural elements of each apparatus. It is also possible to provide a storage medium having the computer program stored therein. The respective functional blocks described in the functional block diagram are configured with hardware, thereby allowing the series of processing to be implemented by the hardware.

It should be understood by those skilled in the art that various modifications, combinations, sub-combinations and alterations may occur depending on design requirements and other factors insofar as they are within the scope of the appended claims or the equivalents thereof.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

An imaging apparatus including:
  at least a first imaging element and a second imaging element each configured to perform imaging in a same direction, in which
  at least any of the first imaging element or the second imaging element is different in pixel arrangement between a central part and a part other than the central part.

(2)

The imaging apparatus according to (1), in which
  the first imaging element has same pixel arrangement in all parts, and
  the second imaging element is different in pixel arrangement between the central part and the part other than the central part.

(3)

The imaging apparatus according to (1) or (2), in which
  the second imaging element includes pixels the part other than the central part of which has higher sensitivity than sensitivity of the central part.

(4)

The imaging apparatus according to (3), in which
  the second imaging element has pixels arranged in a region other than the central part, the pixels including at least a white pixel.

(5)

The imaging apparatus according to (4), in which
  the second imaging element has white pixels arranged in all regions other than the central part.

(6)

The imaging apparatus according to (3), in which
  the second imaging element has pixels arranged in a region other than the central part, the pixels including at least a color that is not included in the central part.

(7)

The imaging apparatus according to (6), in which the second imaging element has pixels arranged in the region other than the central part, the pixels including a pixel that detects infrared light.

(8)

The imaging apparatus according to (6) or (7), in which information is identified with the pixels of the second imaging element in the region other than the central part.

(9)

The imaging apparatus according to (8), in which the information that is identified is an object.

(10)

The imaging apparatus according to (8), in which the information that is identified is a light source.

(11)

The imaging apparatus according to any of (1) to (10), further including:

a combination section configured to combine an output of the first imaging element with an output of the second imaging element.

(12)

The imaging apparatus according to (11), in which the combination section changes a combination ratio in accordance with image height of the first imaging element.

(13)

The imaging apparatus according to (11), in which the combination section changes a combination ratio in accordance with a shading characteristic for the first imaging element.

(14)

The imaging apparatus according to any of (1) to (13), in which a pixel of the second imaging element is minuter than a pixel of the first imaging element.

(15)

The imaging apparatus according to any of (1) to (13), in which a pixel of the first imaging element and a pixel of the second imaging element have same size.

(16)

The imaging apparatus according to (15), in which the pixels of the first imaging element have a same color in a unit of two pixels in height by two pixels in width.

(17)

An imaging apparatus including:

at least a first imaging element and a second imaging element each configured to perform imaging in a same direction, in which a region of the second imaging element which is a region having substantially a same angle of view as an angle of view of a central part of the first imaging element has same pixel arrangement, and a region of the second imaging element which is a region having substantially a same angle of view as an angle of view of a part other than the central part of the first imaging element has different pixel arrangement.

REFERENCE SIGNS LIST 100 imaging apparatus
110, 120 imaging unit
111, 121 lens
112, 122 IR cut filter
113, 123 imaging element

What is claimed is:

1. An imaging apparatus, comprising:
a first imaging element and a second imaging element each configured to capture images in a same scene at different imaging magnifications,
wherein the first imaging element has a Bayer pixel arrangement occupying a total area of the first imaging element,
wherein pixels of the Bayer pixel arrangement of the first imaging element have a first number of pixels and a first size of the pixels,
wherein the second imaging element has a same Bayer pixel arrangement as the Bayer pixel arrangement of the first imaging element,
wherein the Bayer pixel arrangement of the second imaging element occupies a central part of the second imaging element,
wherein the pixels of the Bayer pixel arrangement of the second imaging element have the first number of pixels and a second size of the pixels, and
wherein the first size of the pixels is larger than a second size of the pixels.

2. The imaging apparatus according to claim 1, wherein the second imaging element includes pixels around a periphery of the second imaging element different from the pixels of the Bayer pixel arrangement.

3. The imaging apparatus according to claim 2, wherein the pixels around the periphery of the second imaging element have a higher sensitivity than a sensitivity of the pixels occupying the central part of the second imaging element.

4. The imaging apparatus according to claim 3, wherein the pixels around the periphery of the second imaging element include at least a one white pixel.

5. The imaging apparatus according to claim 4, wherein the pixels around the periphery of the second imaging element are white pixels.

6. The imaging apparatus according to claim 3, wherein the pixels around the periphery of the second imaging element include a color that is not included in the central part.

7. The imaging apparatus according to claim 6, wherein the pixels around the periphery of the second imaging element include a pixel that detects infrared light.

8. The imaging apparatus according to claim 7, wherein the pixel that detects infrared light is used to identify information output from data of the second imaging device.

9. The imaging apparatus according to claim 8, wherein the information that is identified is an object.

10. The imaging apparatus according to claim 8, wherein the information that is identified is a light source.

11. The imaging apparatus according to claim 1, further comprising: a combination section configured to combine an output of the first imaging element with an output of the second imaging element.

12. The imaging apparatus according to claim 11, wherein the combination section changes a combination ratio in accordance with image height of the first imaging element.

13. The imaging apparatus according to claim 11, wherein the combination section changes a combination ratio in accordance with a shading characteristic for the first imaging element.

14. The imaging apparatus according to claim 1, wherein the pixels of the first imaging element have a same color in a unit of two pixels in height by two pixels in width.

* * * * *